US006977137B2

(12) United States Patent
Borrelli et al.

(10) Patent No.: US 6,977,137 B2
(45) Date of Patent: Dec. 20, 2005

(54) DIRECT WRITING OF OPTICAL DEVICES IN SILICA-BASED GLASS USING FEMTOSECOND PULSE LASERS

(75) Inventors: Nicholas F. Borrelli, Elmira, NY (US); Joseph F. Schroeder, Lindley, NY (US); Charlene M. Smith, Corning, NY (US); Alexander Streltsov, Painted Post, NY (US)

(73) Assignee: Corning Incorporated, Corning, NY (US)

( * ) Notice: Subject to any disclaimer, the term of this patent is extended or adjusted under 35 U.S.C. 154(b) by 632 days.

(21) Appl. No.: 09/954,500

(22) Filed: Sep. 17, 2001

(65) Prior Publication Data

US 2002/0076655 A1 Jun. 20, 2002

Related U.S. Application Data

(63) Continuation-in-part of application No. 09/627,868, filed on Jul. 28, 2000, now abandoned.
(60) Provisional application No. 60/146,274, filed on Jul. 29, 1999, and provisional application No. 60/172,122, filed on Dec. 17, 1999.

(51) Int. Cl.[7] .............................. G03F 7/00; C03C 23/00
(52) U.S. Cl. ......................... 430/321; 430/322; 430/945
(58) Field of Search ................................ 430/321, 198, 430/322, 945, 950

(56) References Cited

U.S. PATENT DOCUMENTS

| 4,270,130 A | 5/1981 | Houle et al. .............. 346/77 E |
| 4,474,427 A | 10/1984 | Hill et al. ................... 350/96.3 |
| 4,641,924 A | 2/1987 | Nagae et al. ............. 350/339 R |
| 4,807,950 A | 2/1989 | Glenn et al. ............... 350/3.61 |
| 4,847,138 A | 7/1989 | Boylan et al. .............. 428/209 |
| 5,104,209 A | 4/1992 | Hill et al. ...................... 385/27 |
| 5,157,674 A | 10/1992 | Lawandy ...................... 372/22 |
| 5,178,978 A | 1/1993 | Zanoni et al. ................ 430/11 |
| 5,253,198 A | 10/1993 | Birge et al. .................. 365/106 |

(Continued)

FOREIGN PATENT DOCUMENTS

| EP | 0 569 182 B1 | 12/1997 |
| JP | 9-311237 | 2/1997 |
| JP | 11255536 A | 9/1999 |
| WO | WO 93/16403 A1 | 8/1993 |
| WO | WO 97/32821 A1 | 9/1997 |

OTHER PUBLICATIONS

RR Krchnavek, GR Lalk, and DH Hartman, "Laser direct writing of channel waveguides using spin-on polymers", J. Appl. Phys. 66 (11), Dec. 1, 1989, pp. 5156–5160.

(Continued)

*Primary Examiner*—Yvette C. Thornton
(74) *Attorney, Agent, or Firm*—Gregory V. Bean; James V. Suggs

(57) ABSTRACT

The invention relates to methods of writing a light-guiding structure in a bulk glass substrate. The bulk glass substrate is preferably made from a soft silica-based material having an annealing point less than about 1380° K. A pulsed laser beam is focused within the substrate while the focus is translated relative to the substrate along a scan path at a scan speed effective to induce an increase in the refractive index of the material along the scan path. Substantially no laser-induced physical damage of the material is incurred along the scan path. Various optical devices can be made using this method.

8 Claims, 12 Drawing Sheets

U.S. PATENT DOCUMENTS

| | | | |
|---|---|---|---|
| 5,285,517 A | 2/1994 | Wu | 385/142 |
| 5,289,407 A | 2/1994 | Strickler et al. | 365/106 |
| 5,325,324 A | 6/1994 | Rentzepis et al. | 365/127 |
| 5,616,159 A | 4/1997 | Araujo et al. | 65/17.4 |
| 5,627,933 A | 5/1997 | Ito et al. | 385/123 |
| 5,656,186 A | 8/1997 | Mourou et al. | 219/121.69 |
| 5,675,691 A | 10/1997 | Edlinger et al. | 385/130 |
| 5,761,111 A | 6/1998 | Glezer | 365/106 |
| 5,773,486 A | 6/1998 | Chandross et al. | 522/33 |
| 5,841,928 A | 11/1998 | Maxwell et al. | 385/129 |
| 5,919,607 A | 7/1999 | Lawandy | 430/326 |
| 5,978,538 A | 11/1999 | Miura et al. | 385/123 |
| 6,075,625 A | 6/2000 | Ainslie et al. | 359/3 |
| 6,154,593 A | 11/2000 | Miura et al. | 385/123 |
| 6,297,894 B1 | 10/2001 | Miller et al. | 359/35 |

OTHER PUBLICATIONS

Y. Komdo, t. Suzuki, H. Inouye, K. Miura, T. Mitsuyu, and K. Hirao, "Three–dimensional Microscopic Crystallization In Photosensitive Glass by Femtosecond Laser Pulses at Nonresonant Wavelength", J. Appl. Phys., Part 2 (Letters), vol. 37. No. 1A–B, pp. L94–6.

K. Hiro and K. Miura, "Writing waveguides and gratings in silica and related materials by a femtosecond laser"., Journal of Non–Crystalline Solids 239 (1998), pp. 91–95.

Y. Kondo, K. Nouchi, T. Mitsuyu, M. Watanabe, PG Karansky, and K. Hirao, "Fabrication of long–period fiber gratings by focused irradiation of infrared femtosecond laser pulses", Optics Letters/vol. 24, No. 10, May 15, 1999, pp. 646–648.

KM Davis, K. Miura, N. Sugimoto, and K. Hirao, "Writing waveguides in glass with a femtosecond laser", Optics Letters, vol. 21, No. 21, Nov. 1, 1996, pp. 1729–1731.

NF Borelli, CM Smith, and DC Allan, "Excimer–laser–induces densification in binary silica glasses", Optics Letters, vol. 24, No. 20, pp. 25–27.

K. Miura, J. Qiu, H. Inouye, T. Mitsuyu, and K. Hirao, "Photowritten optical waveguides in various glasses with ultrashort pulse laser", Appl. Phys. Letter 71 (23), Dec. 8, 1997, pp. 3329–3331.

NF Borrelli, C. Smith, DC Allan, and TP Seward III, "Densification of fused silica under 193–nm exicitation", Journal of Opt Soc. Am. B, vol. 14, No. 7, Jul. 1997, pp. 1606–1615.

GH Beall, "Industrial Applications of Silica", Reviews in Mineralogy, vol. 29, pp. 469–505.

K. Hirao and K. Miura, Technical Digest International Workshop on Structure and Functional Optical Properties of Silica and Silica–Related Glasses, "Writing waveguides in silica–related glasses with femtosecond laser", Jul. 10–11, 1997, pp. 103–105.

K.M. Davis, K. Miura, N. Sugimoto, and K. Hirao, "Writing waveguides in glass with a femtosecond laser", Optics Letters, vol. 21, No. 21, Nov. 1, 1996, pp. 1729–1731.

K. Miura, H. Inouye, J. Qiu, T, Mitsuyu, and K.Hirao, "Optical waveguides induced in inorganic glasses by a femtosecond laser", NIMB, B, 141, 1998, pp. 726–732, p 3.

K. Hirao, and K, Miura, "Writing waveguides in Silica–related Glasses with Femtosecond Laser", Jpn. J. Appl. Phys., vol. 37, 1998, Suppl. 37–1, pp. 49–52, p 11.

K. O. Hill, Y. Fujii, D. C. Johnson, and B. S. Kawasaki, "Photosensitivity in optical fiber waveguides: Application to reflection filter fabrication", Appl. Phys. Lett. 32,(10), May 15, 1978, pp. 647–649, p 15.

E. N. Glezer, M. Milosavljevic, L. Huang, R. J. Finlay, T.–H Her, J. P. Callan, and E, Mazur, "Three–dimensional optical storage inside transparent materials", Opt. Lett. vol. 21, No. 24, Dec. 15, 1996, pp. 2023–2025, p 19.

HPFS® Standard Grade, www.hpfs.corning.com, Corning incorporated, May 1999.

HPFS® Arf Grade, www.hpfs.corning.com,, Corning Incorporated, May 1999.

HPFS® KrF Grade, www.hpfs.corning.com, Corning Incorporated, May 1999.

Indigo —DUV, Positive Light, www.poslight.com, May 2000.

Indigo—SLM, Positive Light, www.poslight.com, Oct. 1999.

*Custom Lasers, Positive Light*, www.poslight.com, Oct. 1999.

Positive Light New Products, www.hpfs.corning.com,, Sep. 21, 2000.

Coherent, Innova Sabre FRED Technical Data, Frequency–Doubled Ion Laser System, copyright 1996, www.coherentinc.com.

Coherent—Laser Applications—Lithography, www.coherentinc.com, Sep. 21, 2000.

Coherent—Products—Lasers—Ion—Innova Sabre FRED, www.coherentinc.com, Sep. 21, 2000.

CYMER®, Cymer, Products; Background, www.cymer.com, Sep. 21, 2000.

CYMER®, Cymer, Products; 248 nm KrF Product Family, www.cymer.com, Sep. 21, 2000.

CYMER®, Cymer, Products; 193 nm ArF Product Family, www.cymer.com, Sep. 21, 2000.

A. Nakajima, "Glass emerges as data–storage contender", Science & Technology.

DIRECT WRITING OF OPTICAL DEVICES IN SILICA-BASED GLASS USING FEMTOSECOND PULSE LASERS

RELATED APPLICATIONS

This application is a continuation-in-part of U.S. patent application Ser. No. 09/627,868, filed Jul. 28, 2000, now abandoned, which claims priority to U.S. Provisional Patent Application No. 60/146,274, filed Jul. 29, 1999, entitled Direct Writing of Optical Devices in Silica-Based Glass Using Femtosecond Pulse Lasers of Nicholas F. Borrelli and Charlene Smith and to U.S. Provisional Patent Application No. 60/172,122, filed Dec. 17, 1999, entitled Femtosecond Laser Writing of Glass, Including Borosilicate, Sulfide and Lead Glasses of Nicholas F. Borrelli, David L. Morse, Alexander Streltsov, and Bruce Aitken.

TECHNICAL FIELD

The invention relates to methods for efficiently forming optical devices in glass. Specifically, the invention relates to direct-write methods of forming light-guiding structures in glass compositions through light-induced refractive index changes using pulsed lasers having a pulse duration less than about 150 femtoseconds (fs). The invention also relates to the optical devices made by the direct-write methods.

BACKGROUND

Optical waveguides and other light-guiding or light-managing structures provide much of the terrestrial high-speed infrastructure of the telecommunications industry. Light-guiding waveguides, which are formed by surrounding a higher refractive index core with a lower refractive index cladding, support transmissions of large amounts of optical information over long distances with little signal attenuation. Light-managing waveguides include such structures as optical gratings, which are formed by index perturbations spaced along limited lengths of the waveguides to separate narrow bands of wavelengths from broader band signals.

The waveguides generally take fiber or planar forms fashioned from doped silica-based materials exhibiting contrasting refractive indices. Further variations in refractive indices for forming gratings and other optical structures can be made by exposing photosensitive optical materials to patterns of actinic radiation within the absorption spectra of the optical materials. The absorption mechanism limits the photo-induced variations to surfaces or regions near the surfaces of homogeneous optical materials.

Recently, high energy pulses beyond the absorption edge of silica-based materials have been demonstrated to produce refractive index changes inside bulk glass. Such changes open possibilities for manufacturing three-dimensional optical circuitry in which light-guiding or light-modifying structures are formed throughout glass volumes. Eventually, this capability is expected to simplify manufacture and reduce space requirements of optical structures performing complex or numerous optical functions.

For example, an 810 nanometer (nm) wavelength Ti:Sapphire laser emitting 120 femtosecond (fs) pulses at 200 kilohertz (kHz) has been used to direct write the cores of waveguides in silica-based glass samples. The pulses at 810 nm are well beyond the absorption edge of the silica glass samples. Focused laser beam power reaching the glass samples was regulated by filters between 40 and 800 milliwatts (mW). Translation speeds between the laser beam and the glass samples varied between 100–10,000 microns per second ($\mu$m/s). Refractive index (n) increases of nearly 0.04 were reported, which apparently resulted from repeated exposures. Core diameters written into glass samples varied as a function of the average beam power reaching the samples.

The mechanism responsible for the index change in the silica-based glass samples is not well understood. However, since the index change is produced by high energy pulses at wavelengths beyond the absorption edge of the glass samples, multiphoton (i.e., non-linear) absorption is believed to be at least partially responsible. Speculations relating to the changes in the glass include local densification, the formation of color centers, lattice defects, and melting. Reports suggest that increasing the peak power or the duration of exposure increases the change in refractive index.

Amplified femtosecond pulse sources, such as the Ti:Sapphire laser referred to above, have pulse rates in the kilohertz (kHz) range and pulse energies in the microjoule ($\mu$J) range. Since the thermal diffusion time of silica and related materials is in the order of a few microseconds ($\mu$s), each pulse heats independently of the others. However, the amplified femtosecond pulses have sufficient energy to raise the instantaneous temperature of the glass materials to 1000 degrees centigrade (°C.) or more, which is large enough to produce local thermal damage.

While the requisite index changes for writing waveguides have been demonstrated, actual light-guiding properties associated with the index changes in bulk glass materials have been inconsistent. At least some of the material changes including the formation of voids and other defects associated with the change in index physically damage the index-modified glass. The physical damage can attenuate optical signals transmitted through the glass.

To make the femtosecond laser direct-write method practical, substantial changes in the refractive index (e.g., $>10^{-3}$) of a material must be achieved in a reasonable amount of writing time without incurring physical damage that interferes with the intended waveguiding function. Such a method could be used to write continuous light-guiding waveguide patterns connecting any two points within a continuous block of a suitable material or make other optical devices, such as optical gratings.

SUMMARY OF INVENTION

Our invention in one or more of its embodiments provides improved direct-write methods of forming light-guiding and light-managing structures within silica-based material substrates. Three-dimensional light-guiding and light-managing structures, such as waveguides and gratings, are direct-written into bulk glass at efficient rates using pulse energy levels limited for achieving desired changes in refractive index while avoiding other changes harmful to waveguiding properties of the bulk glass.

We have discovered that an effective regime for writing waveguides in silica-based material substrates (i.e., bulk glass) is one in which the change in refractive index is subject to competing effects between a non-linear absorption mechanism, such as tunneling, and the generation of heat. While the effects of heat, which tend to reverse the positive effects of non-linear adsorption on the change in refractive index, are not desirable, the reversing effect of the heat identifies the maximum pulse energies that can be used for increasing refractive index without harming the waveguiding properties of the glass.

Sufficient pulse energy is needed to induce index increases in silica-based material substrates. Progressively higher pulse energies produce further increases in refractive index up to a saturation point, where the competing effects of heat prevent further increases in refractive index. Just above the saturation point, heat accompanying the higher pulse energies can undo the previous increases in the refractive index. However, the substantial increases in pulse energy beyond the saturation point are accompanied by physical damage to the glass.

For example, the change in refractive index induced by ~800 nanometer (nm) wavelength, ~40 femtosecond (fs) duration pulses, point focused through a numerical aperture (NA) of ~0.26 in the silica-based material saturates at pulse energies approaching 1 microjoule ($\mu$J) (i.e., around 0.8 $\mu$J for fused silica and around 0.5 $\mu$J for borosilicates). Just above the saturation point, increases in pulse energy can result in a decrease in refractive index with respect to the refractive index at the saturation point. However, at pulse energies well above 1 microjoule ($\mu$J) in the same writing configuration, physical damage occurs that detracts from the waveguiding properties of the glass. Small voids or other discontinuities are believed to be formed in the bulk glass, which disrupt the transmission of light.

At pulse repetition rates in the kilohertz (kHz) range, which is typical of amplified femtosecond pulse sources, each pulse heats independently of the others. However, sufficient pulse energy can raise local temperatures in the bulk glass to 1000 degrees centigrade (°C.) or more. Initial increases in the refractive index induced by femtosecond pulses as described above can be erased by heating the glass to temperatures around 500 degrees centigrade (°C.). However, the countering effects of temperature can be used as a marker to identify the maximum pulse energies that can be employed to induce refractive index increases without also inducing physical damage in the bulk glass.

Pulse durations are preferably kept as short as possible to maximize the exposure intensity of pulses having limited pulse energy. The pulse energy is more linked to the generation of heat than is the pulse intensity. The repetition rate is also preferably increased as much as possible to maximize writing rates. However, the maximum pulse rates of amplified femtosecond pulse sources are still expected to remain slower than the thermal diffusion rate of the silica-based material substrates, so the heating effects of the pulses remain substantially independent.

The numerical aperture (NA) of the lens or objective used for point focusing pulsed light within the bulk glass can be varied widely such as between 0.15 and 0.30 but is preferably greater than 0.2 to increase the intensity of the focus and avoid distortion of the resulting waveguide shape. At numerical apertures significantly less than 0.2, the confocal parameter prolongs non-linear interaction of the laser light along the optical axis and causes a distortion from round in waveguide shape. However, the desired increase in the numerical aperture is limited to maintain a required working distance for writing inside the bulk glass.

In accordance with another aspect of the invention, it has been discovered that soft silica-based materials exhibit increased sensitivity to ultra-fast laser writing of optical structures in the bulk glass. Femtosecond laser-induced refractive index changes can be more easily produced in silica-based compositions having an annealing point that is lower than that of the 5 mol. % germania ($GeO_2$)–95 mol. % silica ($SiO_2$) system in that lower pulse energies and faster translation speeds can produce equivalent increases in refractive index as harder silica-based materials.

In accordance with another aspect of the invention, a method is provided to directly write light-guiding structures in glass using short-pulse lasers with substantially no physical damage of the glass.

In accordance with another aspect of the invention, a method is provided to write three-dimensional optical structures in silica-based bulk glass. Specifically, the invention provides for translating the refractive index-increasing focus of an ultra-fast laser through a silica-based substrate in the x-, y-, and z-dimensions.

In accordance with still another aspect of the invention, a variety of optical devices are disclosed which incorporate optical structures made by the methods described herein.

These and other aspects of the invention will become apparent to those skilled in the art in light of this disclosure.

DRAWINGS

DETAILED DESCRIPTION

A direct-write method of forming light-guiding structures in a bulk substrate according to the invention includes the steps of selecting a substrate made from a silica-based material in which the light-guiding structure is to be written, focusing a pulsed laser beam at a position within the substrate effective for inducing an increase in the refractive index of a portion of the irradiated material, and translating the substrate and focus with respect to one another to form a light-guiding structure within the substrate along the scan path.

Figure 1:
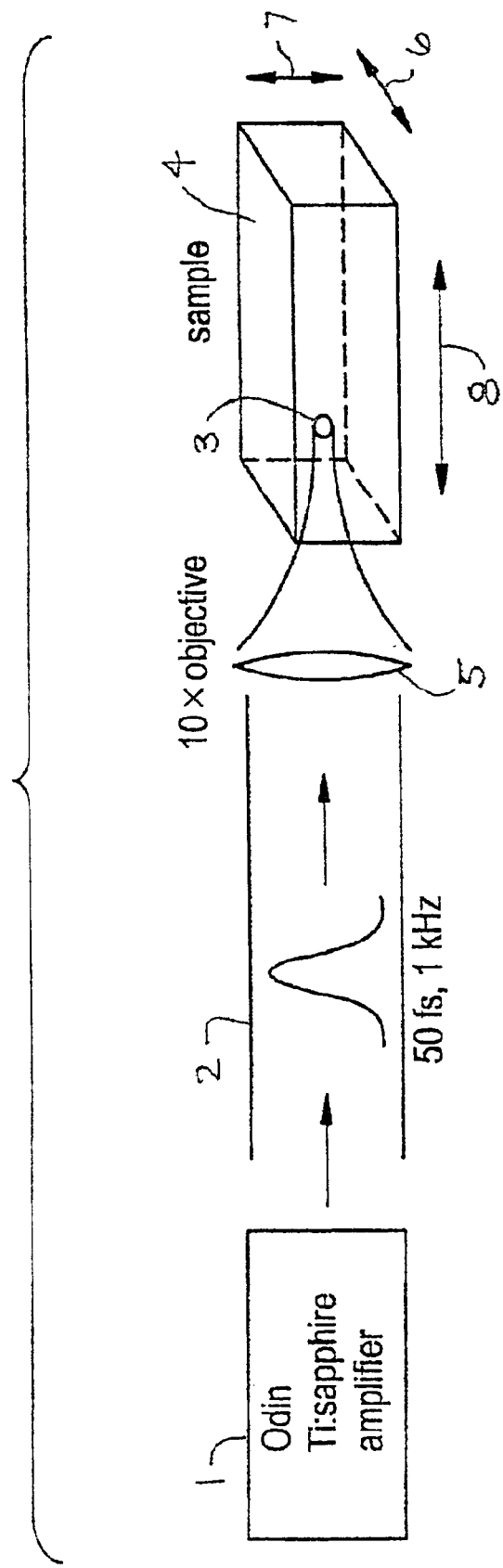
FIG. 1 is a schematic arrangement of equipment used in practicing the invention.

The method can be better understood by reference to a generalized arrangement of an equipment set-up suitable for practicing the invention, as shown in FIG. 1. Laser 1 generates a pulsed laser beam 2 which is focused at a focus 3 positioned within a glass sample 4 by a lens 5. The glass sample is translated in one or more of the x-direction 6, y-direction 7, and z-direction 8 to effect translation of the glass sample 4 with respect to the laser beam focus 3 at a desired translation or scan speed. Such translation of the glass sample 4 with respect to the focal point 3 can be accomplished by a positioning or translation device (not shown), such as a computer-controlled XYZ stage.

Focusing of the laser beam 2 significantly increases the peak intensity of the beam 2 compared to an unfocused beam. The high intensity of the focused beam produces an increase in the refractive index of the glass sample 4 along the path traced by the beam focus 3 as it is translated through the glass sample 4. The resulting region of increased refractive index can guide light and therefore can function as an optical waveguide.

Figure 2A:
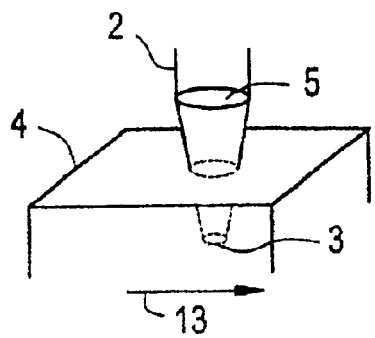
FIG. 2A and FIG. 2B show the positioning of the incident laser beam relative to the scan direction in the top-write and axial-write orientations, respectively.
Figure 2B:
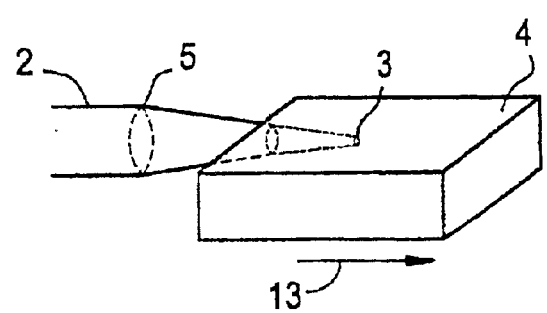

A so-called "top-writing" method involves translating the glass sample 4 in an exemplary scan direction 13 that is substantially perpendicular to the incident beam 2, as shown in FIG. 2A. A so-called "axial-writing" method involves translating the glass sample 4 in an exemplary scan direction 13 that is substantially parallel to the incident beam 2, as shown in FIG. 2B. As the skilled artisan will readily appreciate, "top-writing" can be accomplished by relatively translating the glass sample separately or in any combination of the x-direction 6 and y-direction 7, while "axial-writing" incorporates relative translations of the glass sample in the z-direction 8.

Figure 3A:
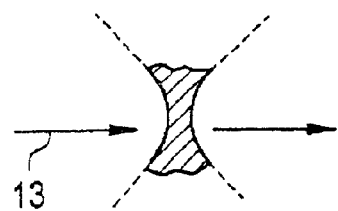
FIG. 3A and FIG. 3B show the scanning beam profile and a photograph of the cross-sectional shape of waveguides in the top-write orientations, respectively.
Figure 3C:
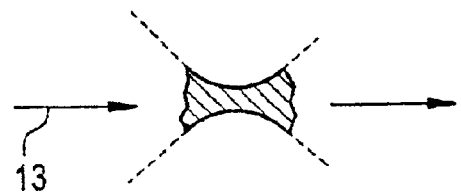
FIG. 3C and FIG. 3D show the scanning beam profile and a photograph of the cross-sectional shape of waveguides in the axial-write orientations, respectively.
Figure 3B:
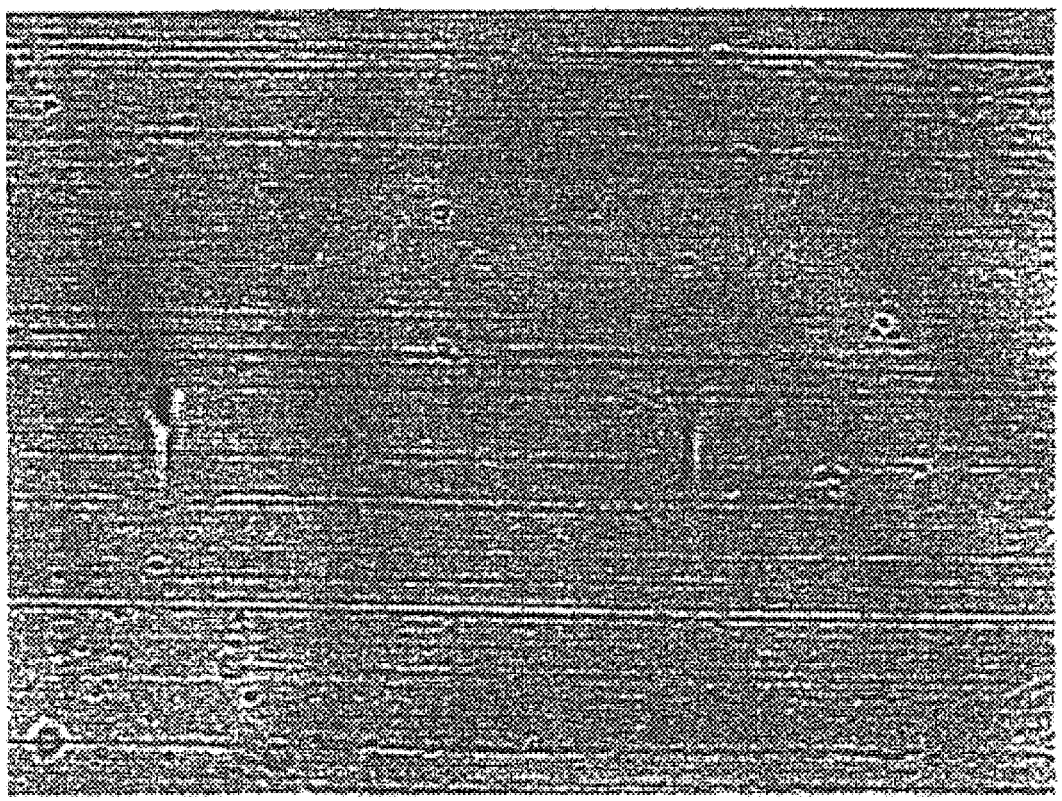
Figure 3D:
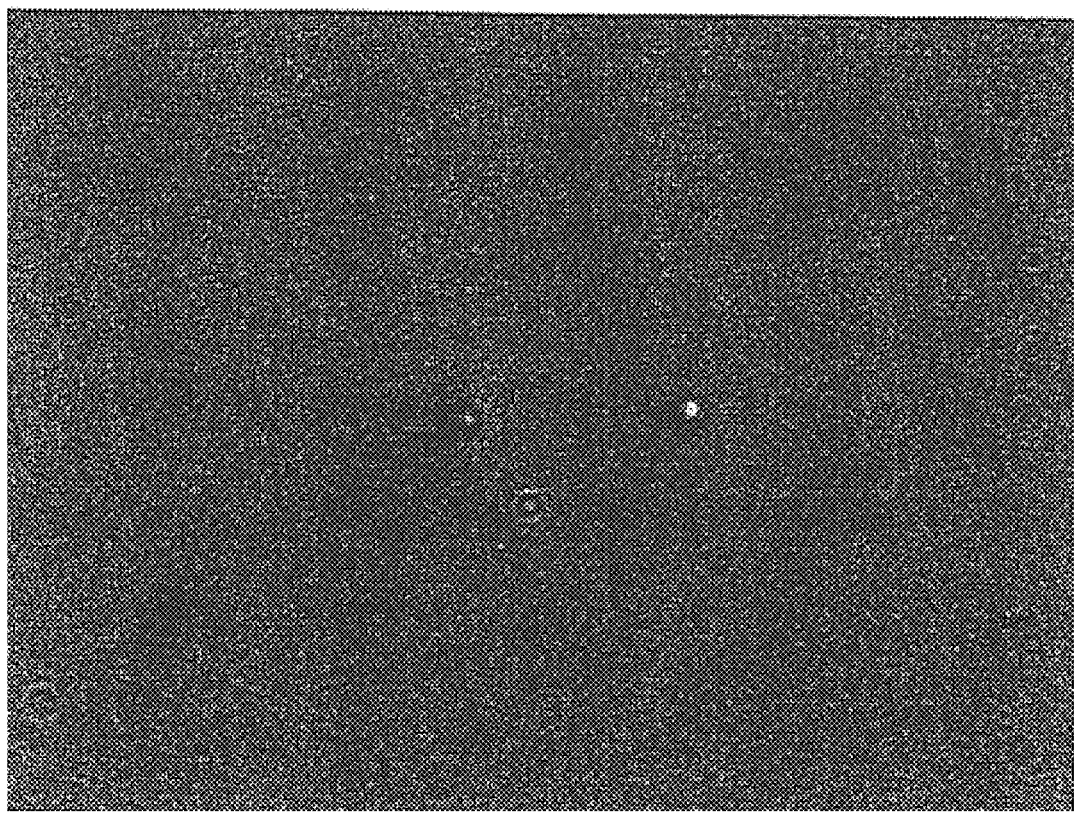

A focus profile and a cross-sectional shape of "top-written" waveguides shown in FIG. 3A and FIG. 3B differ from those of "axial-written" waveguides, as shown in FIG. 3C and FIG. 3D. The beam profile in the vicinity of the focus relative to the scan direction 13 is shown for the "top-write" orientation in FIG. 3A and for the "axial-write" orientation in FIG. 3C. When the "top-write" focus is translated through the glass sample in the scan direction, a generally ellipsoid cross section of the waveguide may be produced, as indicated by FIG. 3B. When the "axial-write" focus is translated through the sample in the scan direction, a generally circular cross section of the waveguide often results, as indicated by FIG. 3D. Accordingly, axially-written waveguides are generally preferred in order to produce waveguides having substantially circular cross sections. Top-writing may be desired in order to write continuous linear waveguides longer than the focal length of the focusing lens 5.

Figure 4A:
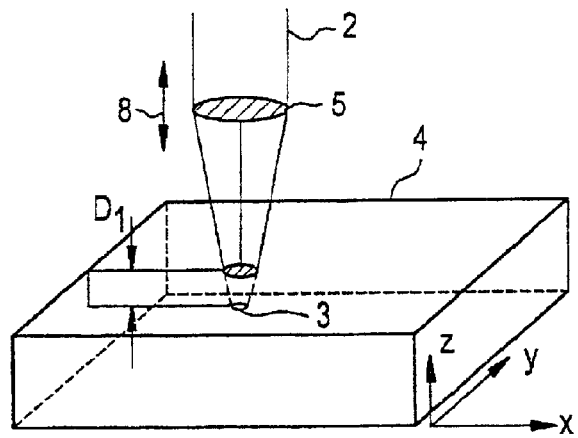
FIG. 4A and FIG. 4B are perspective views of the top-write arrangement of directly writing three-dimensional optical devices in bulk glass.
Figure 4B:
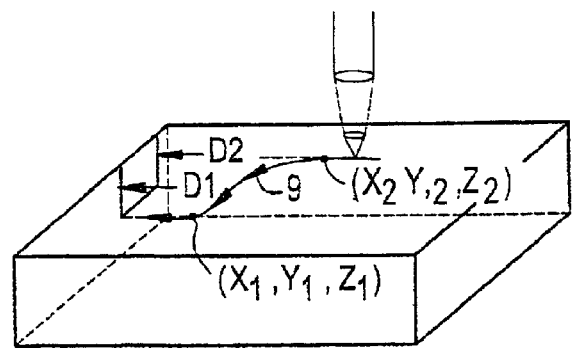

The ability to write three-dimensional waveguides in a glass sample 4 using the present direct-write method is described further with reference to FIGS. 4A and 4B. As shown here, the laser beam 2 is focused by the lens 5 to the focus 3 within glass sample 4. Translation of the sample in the x-, y-, and z-directions from a first position $(x_1, y_1, z_1)$ at depth $D_1$ to a second position $(x_2, y_2, z_2)$ at depth $D_2$ causes an increase in the refractive index of the glass along a scan path 9 to form an optical waveguide extending in three dimensions between the first and second positions within the glass sample 4. If planar, i.e., two-dimensional, waveguides are desired, $x_1$ may be the same as $x_2$, $y_1$ may be the same as $y_2$, or $z_1$ may be the same as $z_2$. If linear waveguides are desired, $x_1$ and $y_1$ may be the same as $x_2$ and $y_2$, respectively; $y_1$ and $z_1$ may be the same as $y_2$ and $z_2$, respectively; or $x_1$ and $z_1$ may be the same as $x_2$ and $z_2$, respectively.

The pulsed laser beam 2 is characterized by several beam parameters. The beam parameters include the wavelength, pulse duration or pulse width, pulse energy, and repetition rate. Preferably, the laser wavelength and glass sample 4 are selected to minimize optical absorption of the beam energy by the sample. In the case of both doped and undoped silica-based glasses, the wavelength can fall within the range of about 400 nm to about 1100 nm, preferably from about 800 nm to about 830 nm. Within this range of wavelengths, the linear absorption of the beam by a silica-based sample is virtually nonexistent. The glass materials intended to be used with this invention are substantially transparent to the wavelengths of interest.

The laser can be any device capable of generating a pulsed laser beam characterized by the desired beam parameters. The laser can be, for example, a Ti:Sapphire amplifier system. One suitable laser is a Quantronix Odin multipass amplifier.

A suitable focusing lens includes a microscope objective having a magnification power of about 5× to about 20×. The focusing lens can have a numerical aperture (NA) between around 0.15 and 0.30 but is preferably greater than 0.2 and more preferably around 0.26. The preferred focusing lens 5 is an aspheric lens for achieving a diffraction-limited spot size of the focused laser beam.

The translating device can be any device capable of translating the sample with respect to the beam focus at the translation speeds of interest. Preferably, the translation speed lies in the range of about 5 microns per second ($\mu$m/s) to about 500 microns per second ($\mu$m/s) or faster. For example, a computer controlled XYZ positioning device, available from the Newport Co., can be used.

The time duration of each pulse, a.k.a., the pulse width, is less than about 150 fs. Lasers having pulse widths of this duration or shorter are referred to as femtosecond or ultrafast lasers. Preferably, the pulse width is about 40 fs to about 60 fs. However, lasers having pulse widths as short as 18 fs have been used to practice the invention. The repetition rate or pulse frequency generally falls within a range extending from about 1 kHz to about 250 kHz for amplified laser systems, with the higher rates generally preferred.

The energy per pulse, or pulse energy, can reach as high as 1.0 millijoule (mJ), but is preferably limited between about 0.1 $\mu$J to about 10.0 $\mu$J depending on other parameters of the writing system. For example, pulse energies less than 1 $\mu$J are preferred for 800 nm, 40 fs pulses focused to diffraction-limited spot sizes through numerical apertures of 0.26. The preferred pulse energy for writing waveguides with such systems in fused silica is around 0.8 $\mu$J and for borosilicates 0.5 $\mu$J.

While the examples below refer to moving the glass sample 4 with respect to a fixed focus 3, the skilled artisan will readily appreciate that alternatively the laser focus 3 could be moved relative to a fixed sample 4, or both the laser focus 3 and sample 4 could be moved simultaneously with respect to a fixed reference point to achieve the desired relative translation speed between the sample 4 and focus 3.

While the drawings have depicted the glass samples 4 suitable for use in the present invention as having substantially planar surfaces oriented at right angles to one another, the skilled artisan will recognize that the invention is not limited to such regular solid geometries. Rather, the invention can be used to direct-write optical waveguides in virtually any regular- or irregular-shaped three-dimensional sample. It is preferred, however, that the sample be positioned relative to the incident laser beam such that the beam is substantially perpendicular to the surface of the sample through which the incident beam passes.

The composition of the substrates in which the light-guiding structures are written by this invention are silica-based materials, including undoped fused silica and doped binary and ternary silica systems. Silica-based materials are preferred in light of their various desirable optical properties as well as their widespread use in telecommunication device applications.

By "silica-based materials", we mean glass compositions that include silica and which are essentially free of alkali, alkaline earth, and transition metal elements, as well as other impurities that would cause absorption in the 1300–1600 nm range. If present at all, such impurities will typically not be found in the silica-based materials used in this invention at levels higher than 10 ppb (parts per billion).

We have found that waveguides can be written more easily in bulk substrates made from soft silica-based glass compositions using lower pulse energies and/or faster translation speeds than in hard silica-based materials without sacrificing the magnitude of the induced index change. Soft silica-based compositions appear to be more sensitive to direct writing of light-guiding structures using ultra-fast (femtosecond) lasers than hard silica-based composition glasses.

For the purposes of this disclosure, "soft" silica-based materials are defined as doped or undoped silica-based materials having an annealing point less than that of 5 mol. % $GeO_2$ –95 mol. % $SiO_2$, i.e., silica-based materials having an annealing point less than about 1380 degrees Kelvin (°K). The preferred silica-based glasses are undoped and doped binary or ternary silica-based materials having an annealing point less than about 1380° K, more preferably less than about 1350° K, and most preferably within the range of about 900° K to about 1325° K. The annealing point is defined as the temperature at which the viscosity of the material is $10^{13.6}$ poise.

Undoped soft silica-based materials include, for example, commercial grade fused silica, such as Corning 7980 glass, which can have an annealing point in the range of about 1261° K to about 1323° K. As for the doped systems, the preferred dopants which can be used to soften silica include oxides of the elements boron, phosphorous, aluminum, and germanium, such as borate ($B_2O_3$), phosphate ($P_2O_5$), alumina ($Al_2O_3$), and germania ($GeO_2$), respectively.

In binary boron-doped silica-based systems, the borate content can comprise up to 20 wt. % or more borate. For example, the binary glass systems 9 wt. % $B_2O_3$–91 wt. % $SiO_2$ and 20 wt. % $B_2O_3$–80 wt. % $SiO_2$ can be used to practice the invention. The annealing point of the 9 wt. % $B_2O_3$–91 wt. % $SiO_2$ composition is about 1073° K. The annealing point of the 20 wt. % $B_2O_3$–80 wt. % $SiO_2$ composition is about 999° K.

In binary phosphorous-doped silica-based systems, the phosphate content can also comprise up to 20 wt. % or more phosphate. For example, the binary glass systems 10 wt. % $P_2O_5$–90 wt. % $SiO_2$ and 7 wt. % $P_2O_5$–93 wt. % $SiO_2$ can be used to practice the invention. The annealing point of the 7 wt. % $P_2O_5$–93 wt. % $SiO_2$ composition is about 1231° K.

In binary aluminum-doped silica-based systems, the alumina content may comprise up to 20 wt. % or more alumina. For example, the binary glass systems 10 wt. % $Al_2O_3$–90 wt. % $SiO_2$ can be used to practice the invention.

In binary germanium-doped silica-based systems, the germania content can comprise up to about 22 wt. % or more germania. For example, the binary glass systems 20 wt. % $GeO_2$–80 wt. % $SiO_2$ and 22 wt. % $GeO_2$–78 wt. % $SiO^2$ can be used to practice the invention. The annealing point of the 20 wt. % $GeO_2$–80 wt. % $SiO_2$ composition is about 1323° K while that of the 22 wt. % $GeO_2$–78 wt. % $SiO_2$ composition is about 1311° K.

"Hard" silica-based materials are defined as doped or undoped silica-based materials having an annealing point higher than that of the 5 mol. % $GeO_2$–95 mol. % $SiO_2$ system, i.e., higher than about 1380° K. Examples of hard silica-based materials include dry fused silica which has an annealing point of about 1425° K. As is generally known in the art, "dry" fused silica has virtually no residual hydroxyl groups, while commercial grade fused silica can have higher levels, for example, about 800 ppm hydroxyl groups.

The skilled artisan will readily appreciate that many other silica-based compositions could be used to practice the invention.

The silica-based materials used in this invention are preferably made by a flame hydrolysis process. In such a process, silicon-containing gas molecules are reacted in a flame to form $SiO_2$ soot particles. These particles are deposited on the hot surface of a rotating body where they consolidate into a very viscous fluid which is later cooled to the glassy (solid) state. In the art, glass-making procedures of this type are known as vapor phase hydrolysis/oxidation processes or simply as flame hydrolysis processes.

Figure 5:
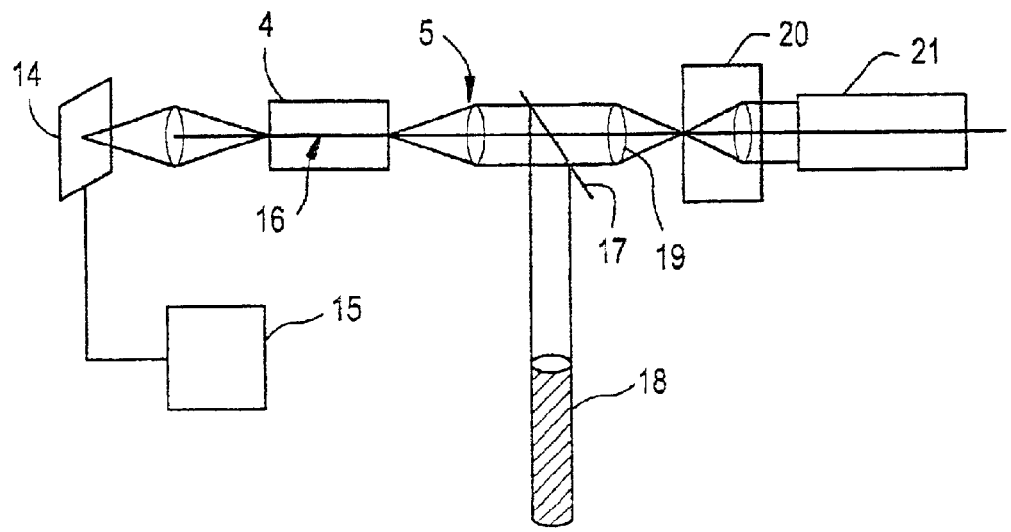
FIG. 5 is a schematic drawing of the equipment set up for observing the far-field pattern.
Figure 6:
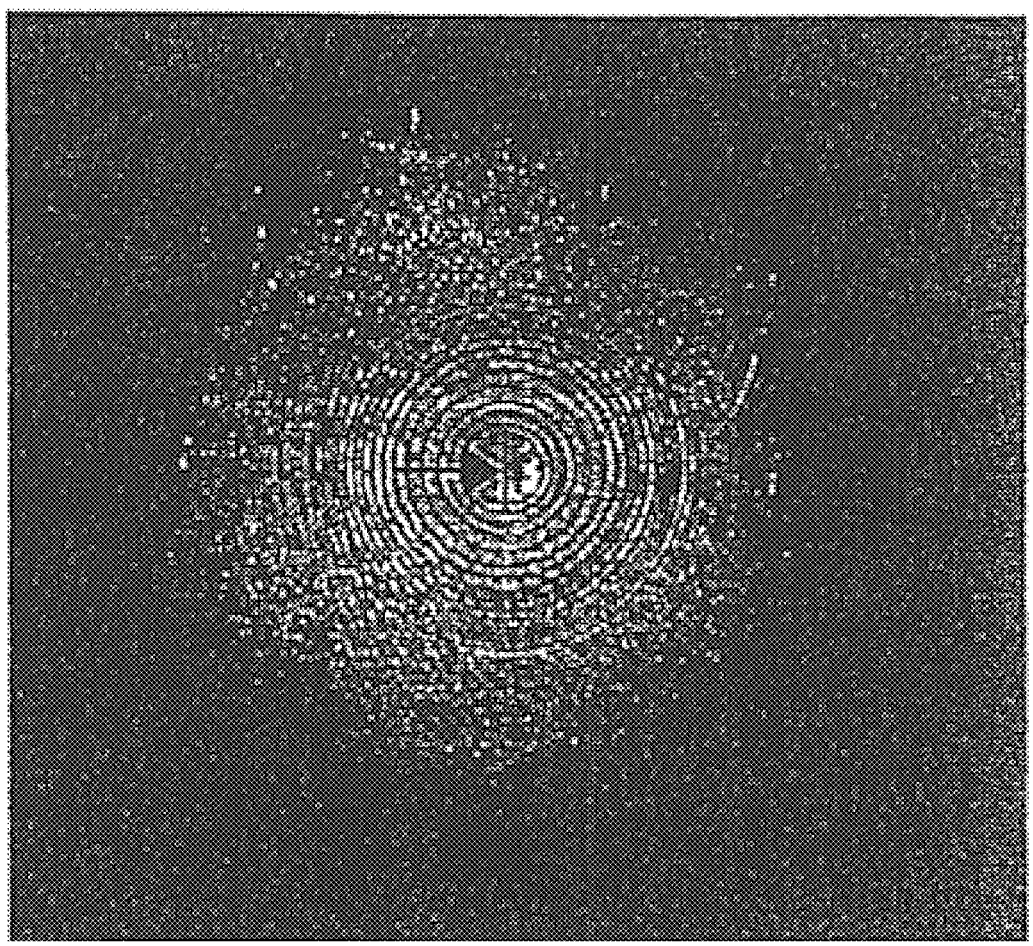
FIG. 6 is a photograph of a far-field intensity pattern of a waveguide written in a silica-based material according to the invention.

The induced refractive index changes reported below in connection with the examples were determined by the beam spread method assuming a step index profile. A schematic of the experimental set-up for estimating the radiation-induced change in the refractive index in the waveguides made according to the invention by this method is shown in FIG. 5. After writing a waveguide 16 in glass sample 4 using a spatial filter 20, a collimating lens 19, a beam splitter 17, a telescope 18, and the lens 5, light from a HeNe laser 21 was coupled into the waveguide 16 and the numerical aperture (NA) of the cone of light that emerged was measured. Since the length of the waveguides made in the example below was typically 1 cm, unguided light from the HeNe laser interfered with the light coupled out the waveguide. This interference resulted in an interference pattern of concentric rings in the far field as recorded by a digital camera 14 and personal computer 15. A recorded image of the interference pattern is shown in FIG. 6.

The radius at which the fringes became indistinguishable, $R_{fringe}$, was measured. The distance from the exit of the waveguides to the viewing surface, L, was fixed at 75 cm. The NA of the waveguide was calculated from the relation $$NA=R_{fringe}/L$$

Assuming a step index profile, the induced refractive index change Δn was then calculated based on the relation $\Delta n=(NA)^2/2n$.

In order that the invention can be more readily understood, reference is made to the following examples, which are intended to be illustrative of the invention, but are not intended to be limiting in scope.

EXAMPLE 1

Pulses from a Ti:Sapphire multi-pass amplifier which were 60-fs in duration and had pulse energies of approximately 1 μJ were focused with a 10× (0.16 NA) microscope objective into fused-silica glass samples mounted on a computer-controlled high-precision 3-D translation stage. The fused-silica samples were translated through the focal point of the beam at a rate of 30 μm/s. Waveguide structures were created within the bulk material.

EXAMPLE 2

A 830 nm laser was used to deliver 40 fs pulses at a 1 kHz repetition rate. The energy per pulse was from about 1 µJ to about 5 µJ. The beam was focused into the glass below the surface with a lens having a numerical aperture of 0.16 in air. The sample was moved under the beam at a rate of about 5 µm/s to about 100 µm/s. The experimental conditions were kept constant for exposure to samples of fused silica and for 14 wt. % $GeO_2$–86 wt. % $SiO_2$. The beam was focused about 1 mm below the surface of the glass. For samples irradiated at the same exposure conditions, the diameter of the laser-affected region of the germania-silica sample was about twice that of the fused-silica sample. From this result, we concluded that the germania-silica material was more sensitive to refractive index changes induced by ultra-fast laser exposure than fused silica.

EXAMPLE 3

Substrates of various glass compositions, i.e., $SiO_2$ (Corning product 7980), 22 wt. % $GeO_2$–78 wt. % $SiO_2$, and 9 wt. % $B_2O_3$–91 wt. % $SiO_2$, were exposed to focused laser radiation by the axial-write method. The laser wavelength was 830 nm. The pulse duration was 40 fs. The energy per pulse was 1.0 µJ. The repetition rate was 1 kHz. The scan speed was 20 µm/s. After exposure, the induced refractive index change at 633 nm was estimated from the far-field pattern of the waveguide produced. The induced refractive index change results are tabulated below in Table 1. The annealing point of each of these materials is also reported in Table 1.

TABLE 1

Induced refraction index change (Example 3)

| Glass Composition (% based on weight) | Annealing Point (° K) | Induced Refractive Index Change |
|---|---|---|
| $SiO_2$ (Corning 7980) | 1261–1323 | 0.0003 |
| 78% $SiO_2$ - 22% $GeO_2$ | 1311 | 0.0009 |
| 91% $SiO_2$ - 9% $B_2O_3$ | 1073 | 0.0030 |

EXAMPLE 4

Figure 7:
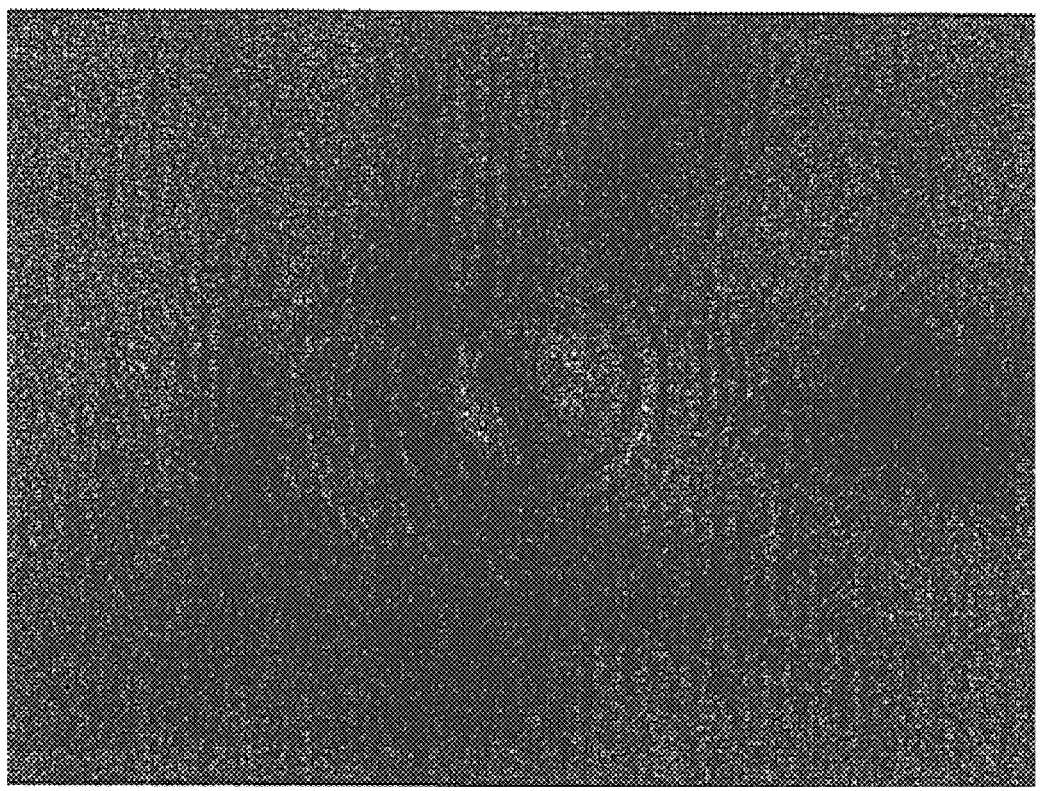
FIG. 7 is a photograph of a far-field intensity pattern of a waveguide written in borate-doped silica according to the invention.

A sample of 9 wt. % $B_2O_3$–91 wt. % $SiO_2$ glass was exposed to focused laser radiation by the axial-write method. The laser wavelength was 830 nm. The pulse duration was 40 fs. The energy per pulse was 1.0 µJ. The repetition rate was 1 kHz. The scan speed was 20 µm/s. A photomicrograph of the far-field pattern of this sample is shown at FIG. 7. The double-lobed pattern is indicative of the propagation of a higher order mode. Insofar as the silica and germania samples of Example 2 showed single-lobe patterns, the effective refractive index change of the borate sample must have been greater than that of the other two samples to support the additional mode.

EXAMPLE 5

Figure 8A:
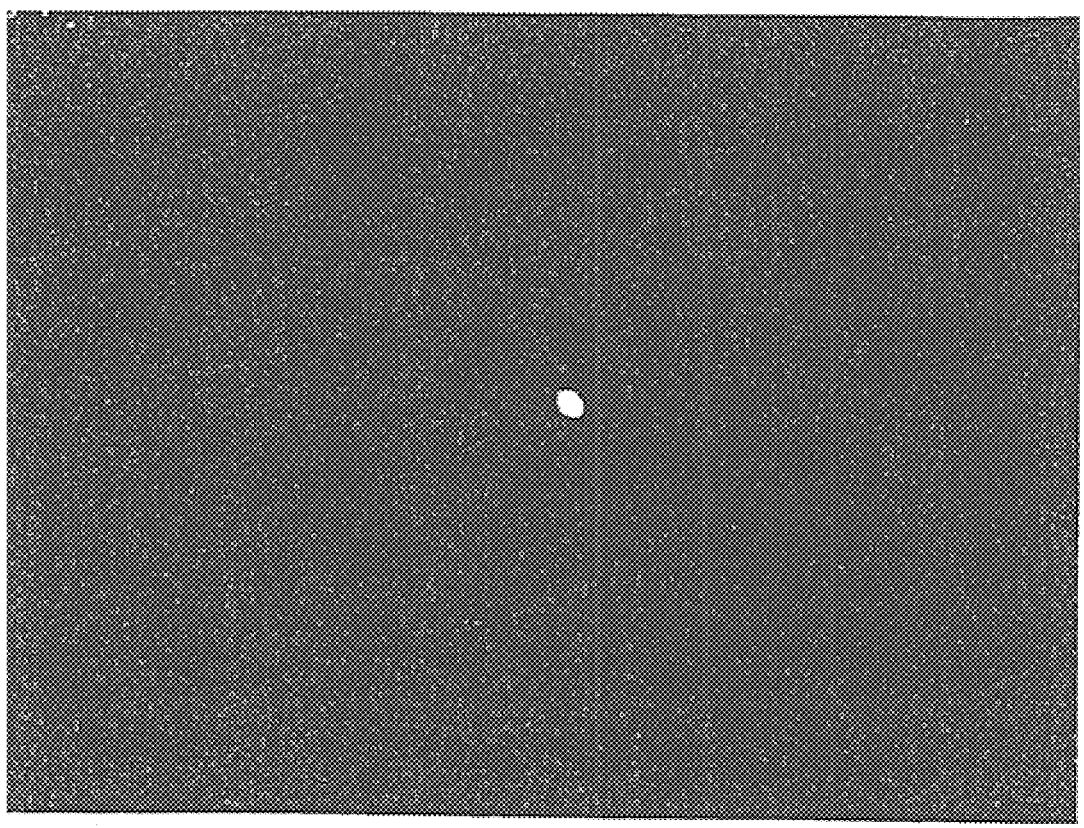
FIGS. 8A–8B are photographs of near-field intensity patterns of waveguides written in fused silica, germania-doped silica.
Figure 8B:
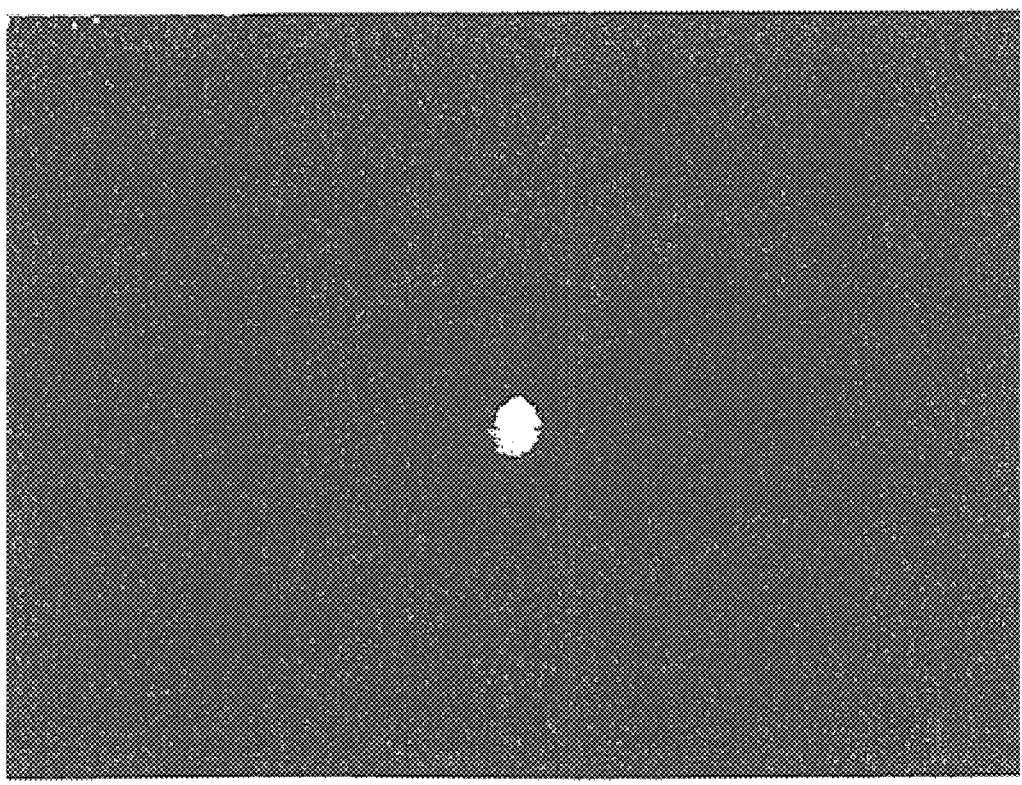
Figure 8C:
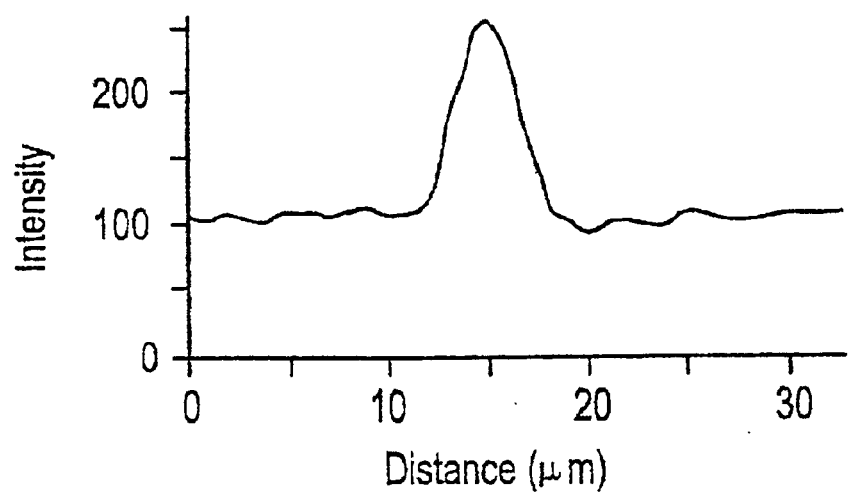
FIGS. 8C and 8D are traces of the intensity of the near-field pattern in soft silica compositions.
Figure 8D:
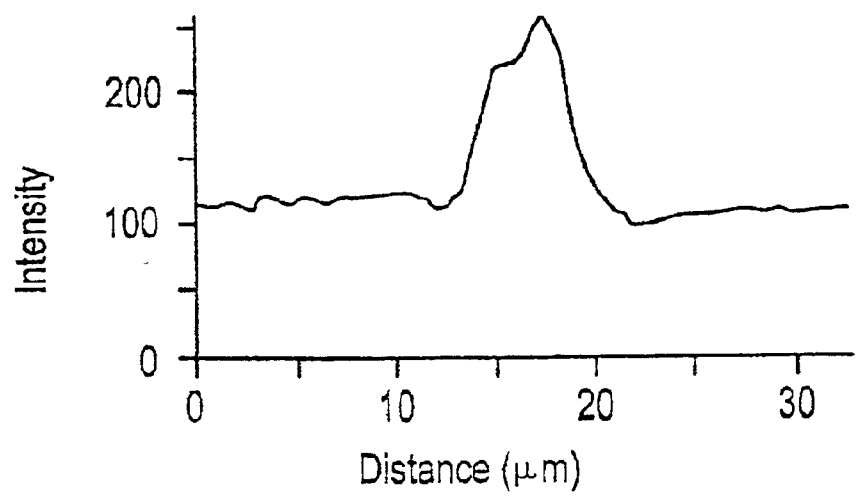

Each of the glass compositions listed in Table 1 were exposed to focused laser radiation. The laser wavelength was 830 nm. The pulse duration was 40 femtoseconds. The energy per pulse was 0.5 µJ. The scan speed was 10 µm/s. After exposure, the samples were photographed through a microscope at a magnification of 400×. The resulting photomicrographs of the $SiO_2$, 22 wt. % $GeO_2$–78 wt. % $SiO_2$, and 9 wt. % $B_2O_3$–91 wt. % $SiO_2$ samples at FIGS. 8A to 8C, respectively, show increasing spot sizes for the softer glass compositions. These results indicate the increased sensitivity of the softer glass compositions to 40 fs pulsed laser irradiation at 830 nm.

The foregoing results strongly suggest that softness of the exposed glass compositions is a key parameter in determining the magnitude of the laser-induced refractive index change.

EXAMPLE 6

Optical waveguides were written in various bulk glasses using femtosecond laser irradiation. A Ti:Sapphire laser is operated at 830 nm with a pulse width within the range of about 40 fs to about 50 fs at pulse energies of 0.5 –10 µJ. The pulse repetition rate was 1 kHz. The beam was focused with a 0.15 NA lens into the block of glass that was translated at linear speeds of 5 –100 µm/s. Assuming a diffraction-limited Gaussian beam, the estimated spot size of the focal point of the beam was 5 µm. The glass was exposed to the beam by translating the block relative to the focal point in the axial direction, i.e., in the direction of the beam. The nominal intensities used for the exposure therefore ranged from 0.05 –1×$10^{15}$ W/$cm^2$. The induced refractive index changes ($10^{-3}$) are reported in Table 2.

TABLE 2

Induced refractive index change ($10^{-3}$) (Example 6)

| Glass (% based on weight) | Pulse Energy (µJ) | Scan Speed (µm/s) | | | | |
|---|---|---|---|---|---|---|
| | | 100 | 50 | 20 | 10 | 5 |
| $SiO_2$ | 2 | 0.4 | — | — | — | — |
| | 1 | 0.2 | 1.2 | 2.4 | 0.8 | — |
| | 0.5 | — | 0.03 | 0.2 | 0.4 | 0.6 |
| 9% $GeO_2$ - 91% $SiO_2$ | 2 | | | 0.5 | 2.6 | |
| | 1 | — | — | 1 | 0.5 | |
| | 0.5 | | | | | |
| 22% $GeO_2$ - 78% $SiO_2$ | 2 | 0.16 | 0.9 | 6 | 16 | — |
| | 1 | 0.01 | 0.2–0.5 | 0.9 | 4–10 | — |
| | 0.5 | — | — | 0.5 | 1–2 | 5 |
| 9% $B_2O_3$ - 91% $SiO_2$ | 2 | 1 | 4* | 8 | | |
| | 1 | 1 | 3–4 | 10* | 10* | |
| | 0.5 | | | 0.04 | 0.1 | |
| $SiO_2$ (hydrogen loaded) | 2 | — | — | — | — | — |
| | 1 | — | — | 0.3 | 1.3 | — |
| | 0.5 | — | — | — | — | — |

*double-lobed pattern

EXAMPLE 7

Optical waveguides were written in fused silica using femtosecond laser irradiation. The Ti:Sapphire laser irradiated at 830 nm with a 150 fs pulse width. The pulse energy was 5, 10, and 20 µJ. The pulse repetition rate was 1 kHz. The beam was focused with a 0.1 NA lens. The glass was substrate was translated at linear speeds of 15, 50, and 500 µm/s. The glass was was exposed to the beam by translating the substrate relative to the focus in the "top-write" orientation, i.e., in a direction perpendicular to the beam. The induced refractive index changes ($10^{-3}$) for example 7 are reported in Table 3.

TABLE 3

Induced refractive index change ($10^{-3}$) (Example 7)

| Glass | Pulse Energy ($\mu$J) | Scan Speed ($\mu$m/s) | | |
|---|---|---|---|---|
| | | 500 | 50 | 15 |
| SiO$_2$ | 20 | 0.1 | | |
| | 10 | | 0.9 | 3 |
| | 5 | | 0.4 | |

EXAMPLE 8

Femtosecond laser pulses were produced by a Quantronix Odin multipass amplifier which was seeded with a mode-locked Ti:Sapphire oscillator. The operating wavelength was 830 nm. The system produced 60-fs pulses at a 1 kHz repetition rate. The laser beam was focused into a sample of fused silica using a 10× (0.16 NA) single aspheric-lens microscope objective. Photonic structures were written by translating the sample with respect to the focal region using computer-controlled three-dimensional stages which had a resolution of 200 nm. By using this objective having this relatively long working-distance, waveguides as long as 2 cm parallel to the beam were written. Using the NA measurement techniques described above, values for the induced refractive index change ($10^{-3}$) of the silica were determined, as reported in Table 4. In all cases, the diameter of the waveguides was approximately 3 $\mu$m. The waveguide diameter appeared to have minimal dependence on the incident pulse energy or the translation speed.

TABLE 4

Induced refractive index change ($10^{-3}$) in fused silica (Example 8)

| Pulse Energy ($\mu$J) | Scan Speed ($\mu$m/s) | | | | | | |
|---|---|---|---|---|---|---|---|
| | 400 | 200 | 100 | 50 | 20 | 10 | 5 |
| 4.0 | — | — | 0.83 | | 3.3* | | |
| 2.0 | — | — | 0.03 | 0.3 | 2.1* | 2.5* | |
| 1.0 | — | — | — | — | 0.065 | 1.1 | 0.97 |
| 0.5 | — | — | — | — | — | — | 0.53 |

*double-lobed far-field intensity pattern that is characteristic of a second mode
— too small to measure

EXAMPLE 9

The experimental conditions of Example 8 were repeated, but the sample was made of the softer glass composition 9 wt. % B$_2$O$_3$–91 wt. % SiO$_2$ rather than fused silica. The values for the induced refractive index change ($10^{-3}$) of the boron-doped silica material are reported in Table 5.

TABLE 5

Induced refractive index change ($10^{-3}$) in boron-doped silica (Example 9)

| Pulse Energy ($\mu$J) | Scan Speed ($\mu$m/s) | | | | | | |
|---|---|---|---|---|---|---|---|
| | 400 | 200 | 100 | 50 | 20 | 10 | 5 |
| 4.0 | 1.2 | 1.7 | 4.03* | | | | |
| 2.0 | 1.1 | 1.4 | 2.5 | 4.03* | 3.3* | 4.8* | |
| 1.0 | — | 1.1 | 1.4 | 3.3* | 4.83* | 3.3* | |
| 0.5 | — | — | 0.13 | 0.83 | 2.1* | | |

*double-lobed far-field intensity pattern that is characteristic of a second mode
— too small to measure In most cases, the same write conditions, including pulse energy and scan speed, produced a larger induced refractive index increase in the boron-doped silica glass than in the fused-silica glass. Accordingly, the exposure required to produce the same degree of index change is significantly less for the boron-doped silica material than for the fused-silica material.

The increased sensitivity of the boron-doped glass compared to the fused-silica glass is illustrated also by comparing the exposure required to produce the characteristic double-lobed far-field pattern as shown in FIG. 6. This pattern appears to correspond to the onset of a second mode.

It is interesting to note that the onset of the second mode for a simple step-index waveguide is given by the equation $2\pi r NA/\lambda = 2.4$.

We measure that at the onset of the double-lobed pattern, the NA is 0.08; and with the measuring wavelength of 633 nm, this value would correspond to a waveguide radius of about 3 $\mu$m, which is approximately the size of the observed guide. In both the boron-doped silica and the pure fused-silica glasses, the response of the material appears to saturate. Attempts to produce index changes larger than the saturation value by either increasing the pulse energy or by reducing the translation speed resulted in damaged waveguides that did not efficiently guide light.

EXAMPLE 10

Figure 9:
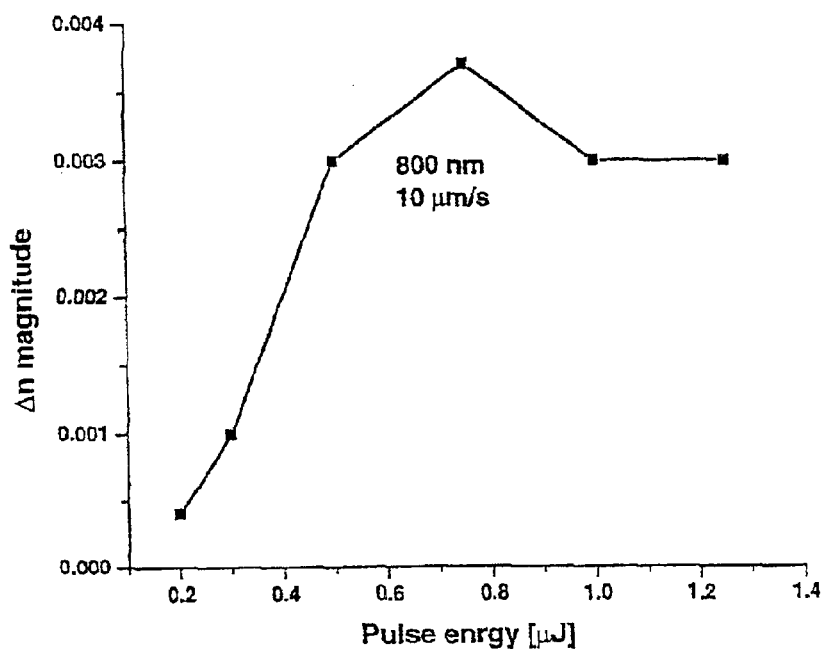
FIG. 9 is a plot of pulse energy and refractive index increase showing a saturation in the increase in refractive index.

A waveguide was written in a sample block of fused silica (SiO$_2$) using a femtosecond amplified laser denoted as a Spectra-Physics Spitfire. The operating wavelength was 800 nm, the pulse rate 20 kHz, and the pulse duration 40 fs. A 10×magnification objective produced an approximately 3 $\mu$m diffraction-limited spot size through a numerical aperture of 0.26. Axial-writing techniques at translating speeds between 10 $\mu$m/s and 20 $\mu$m/s were used to produce a series of waveguides approximately 35 mm in length. Between writings, pulse energies were varied from approximately 0.2 $\mu$J to 1.5 $\mu$J. As shown in FIG. 9, a saturation of the refractive index increase ($\Delta$n) occurred at pulse energies of approximately 0.75 $\mu$J. Higher pulse energies resulted in a reversal of the refractive index increase. Under the same set-up, 400 nm light produced a decrease in refractive index.

EXAMPLE 11

A similar experimental protocol as described in Example 10 was followed for a sample block of borosilicate glass at pulse energies ranging between 0.2 $\mu$J to 1.0 $\mu$J, where a saturation in refractive index increase occurred at 0.5 $\mu$J. Higher energy pulses resulted in a lessening of the refractive index increase of the axially written waveguides. Although less, some increase in refractive index was also achieved using 400 nm light. Table 6 below relates the refractive index increase (Δn) to translating speeds for the two wavelengths at 0.5 µJ pulse energies.

TABLE 6

| speed µm/s | 800 nm<br>Δn × 10⁻³ | 400 nm<br>Δn × 10⁻³ |
|---|---|---|
| 5 | 0.0025 | 0.0052 |
| 10 | 0.002 | 0.0034 |
| 20 | 0.0019 | 0.0029 |
| 50 | 0.003 | 0.002 |
| 100 | 0.0001 | 0.0018 |

As apparent from this table, the translating speed is of lesser importance than such factors as the glass composition, excitation, wavelength, and pulse energy, since the actual exposure time is dominated by the repetition rate. However, if an increase in refractive index is achieved, then decreasing the translating speed increases the change in refractive index and increasing the translating speed, decreases the change in refractive index.

A wide variety of optical devices in bulk glass can be made using the presently described materials and methods. Example 11 describes the fabrication and performance of a Y-coupler device.

EXAMPLE 11

Figure 10:
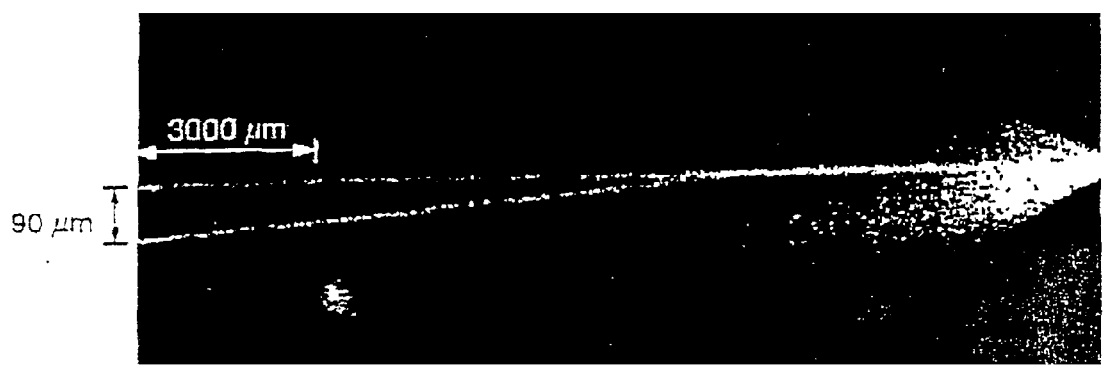
FIG. 10 is a photograph of a Y-coupler written in silica using the invention.

A Y-coupler was written in a bulk sample of pure fused silica at the conditions of Example 1. A photograph of the structure shows the guiding of light from an argon laser, as shown in FIG. 10. The vertical dimension of the photograph is magnified with respect to the horizontal dimension for clarity. The splitting angle was measured as approximately 0.5°. It was observed that approximately half of the 514.5 nm light was coupled into each of the two branches of the coupler.

Figure 11A:
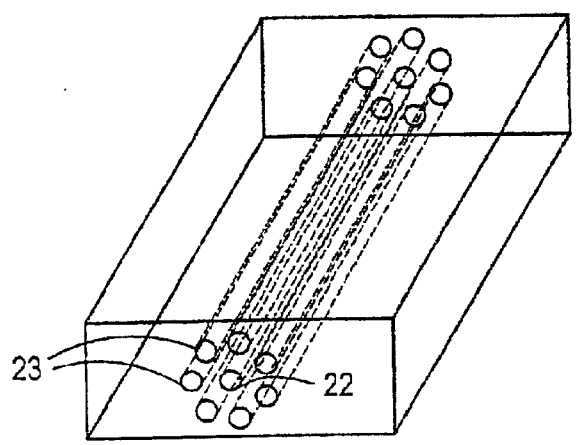
FIGS. 11A–11D show various exemplary optical devices that can be made using the invention.
Figure 11B:
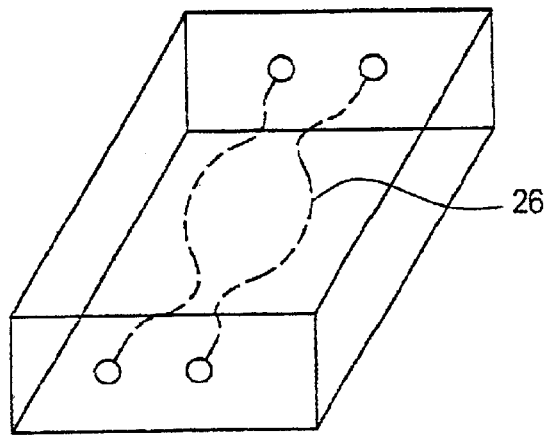
Figure 11C:
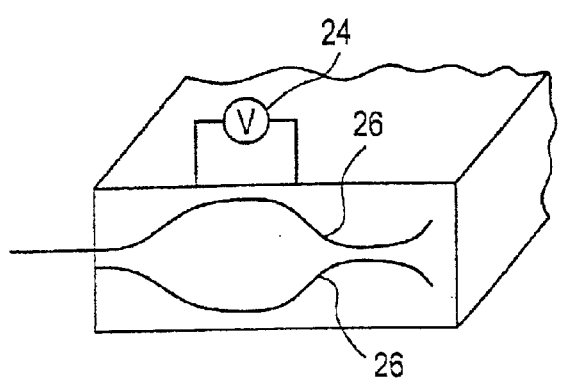
Figure 11D:
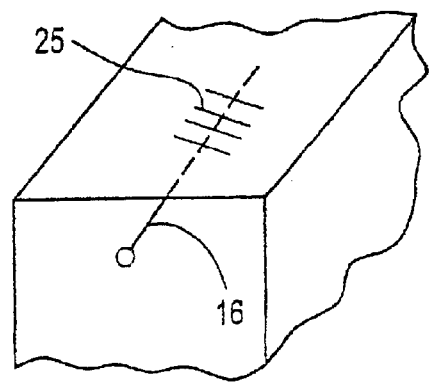

The present invention can also be used to make a wide variety of other optical devices, such as the star coupler having central guide 22 surrounded by a plurality of peripheral guides 23, as shown in FIG. 11A. The invention can also be used to make a passive Mach-Zehnder coupler including a pair of Mach-Zehnder guides 26, as shown in FIG. 11B. An active Mach-Zehnder coupler including Mach-Zehnder guides 26 and a thermal or other type activator 24, as shown in FIG. 11C, could also be made using this invention.

The present invention can also be used to make Bragg gratings or other types of diffraction gratings in bulk glass as shown in FIG. 10. Waveguide 16 leads to grating lines 25. Line spacings of 0.5 µm are possible using this invention. Other devices that can be similarly made according to the invention include directional couplers, star couplers, loop mirrors, demux couplers, an Er-doped single- or multi-stage amplifiers, and devices having surface-modified thermal, piezoelectric, or trench-type activators.

It will be understood that the above described preferred embodiment(s) of the present invention are susceptible to various modifications, changes, and adaptations; and the same are intended to be comprehended within the meaning and range of equivalents of the appended claims.

Further, although a number of equivalent components may have been mentioned herein which could be used in place of the components illustrated and described with reference to the preferred embodiment(s), this is not meant to be an exhaustive treatment of all the possible equivalents, nor to limit the invention defined by the claims to any particular equivalent or combination thereof. A person skilled in the art would realize that there may be other equivalent components presently known, or to be developed, which could be used within the spirit and scope of the invention defined by the claims.

We claim:

1. A method of direct writing a waveguide in a silica-based material substrate comprising the steps of:

producing a pulsed laser beam having a wavelength beyond an absorption edge of the silica-based material substrate and a pulse duration less than 150 femtoseconds (fs);

focusing the laser beam to a spot within the silica-based material substrate;

adjusting pulse energy of the laser beam within a range in which an accompanying generation of heat has the effect of saturating refractive index increases associated with incremental increases in the pulse energy; and relatively translating the beam and silica-based material along a scan path to provide for increasing refractive index along a scan path within the silica-based material while incurring substantially no laser-induced breakdown of the material along the scan path that would inhibit effectiveness of the scan path as a waveguide.

2. The method of claim 1 in which the step of focusing includes focusing the laser beam through a numerical aperture greater than 0.2.

3. The method of claim 2 in which the refractive index increase is saturated at less than 1 microjoule (µJ).

4. The method of claim 3 in which the laser beam has a wavelength of approximately 800 nanometers (nm).

5. The method of claim 4 in which the material is a fused silica and the refractive index increase is saturated at around 0.8 microjoule (µJ).

6. The method of claim 4 in which the material is a borosilicate and the refractive index increase is saturated at around 0.5 microjoule (µj).

7. The method of claim 3 in which the step of producing includes producing the laser beam with a repetition rate that is slower than a thermal diffusion rate of the silica-based material so that each pulse heats the material independently of adjacent pulses.

8. The method of claim 7 in which the pulse duration is less than 50 femtoseconds (fs).

* * * * *